United States Patent [19]

Miloradovic et al.

[11] 4,037,160
[45] July 19, 1977

[54] METHOD AND APPARATUS FOR ADJUSTING AND READJUSTING AN AUTOMATIC CORRECTOR FOR A DATA SIGNAL TRANSMISSION SYSTEM

[75] Inventors: Predrag Miloradovic, Kilchberg; Hans Schaffhauser, Stadel, both of Switzerland

[73] Assignee: Gretag Aktiengesellschaft, Regensdorf, Switzerland

[21] Appl. No.: 635,110

[22] Filed: Nov. 25, 1975

[30] Foreign Application Priority Data

Dec. 6, 1974 Switzerland .................. 16268/74
Dec. 16, 1974 Germany ....................... 2459455

[51] Int. Cl.$^2$ .............................. H03H 7/36
[52] U.S. Cl. ........................... 325/42; 333/18
[58] Field of Search ............. 333/18, 28; 178/69 R; 325/42, 65

[56] References Cited

U.S. PATENT DOCUMENTS

| | | | |
|---|---|---|---|
| 3,614,622 | 10/1971 | Holsinger | 325/42 |
| 3,697,897 | 10/1972 | Chang | 333/18 |

*Primary Examiner*—Benedict V. Safourek
*Attorney, Agent, or Firm*—Pierce, Scheffler & Parker

[57] ABSTRACT

A method of adjusting and readjusting an automatic corrector for a data signal transmission system, the corrector serving to restore pulse-amplitude-modulated signals which have suffered linear distortions in a transmission channel. A transversal filter of the corrector receives during a first adjustment phase a reference signal sequence transmitted over the transmission channel and an identical reference signal produced at the receiving end to produce error signals which serve to adjust the transversal filter coefficients stored in the corrector. The filter coefficients are subdivided into at least two groups and during the first phase one group of filter coefficients is calculated with a more attenuated error signal than the filter coefficients of the other group. In a second adjustment phase the filter coefficients of the transversal filter are readjusted in respect of alterations of the properties of the transmission channel, the error signal formed from the output signal of the transversal filter and the reference values for the latter signal being correlated with the data signal arriving at the input of the transversal filter.

15 Claims, 16 Drawing Figures

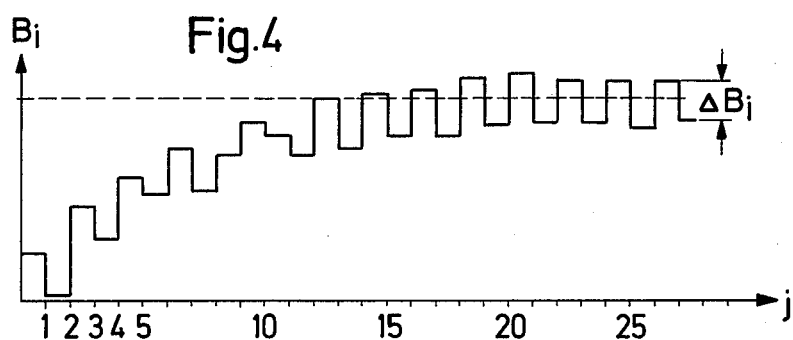
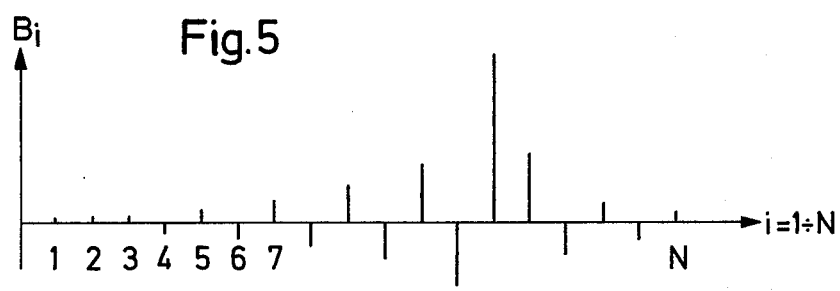
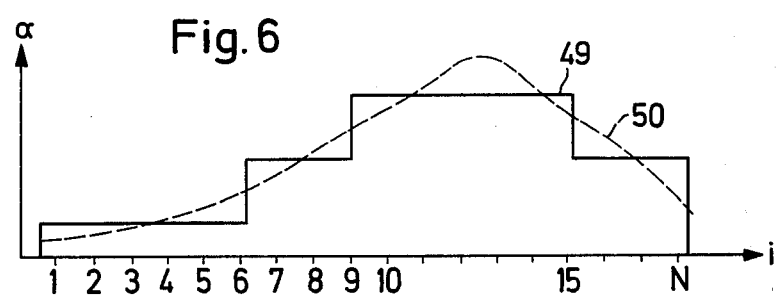
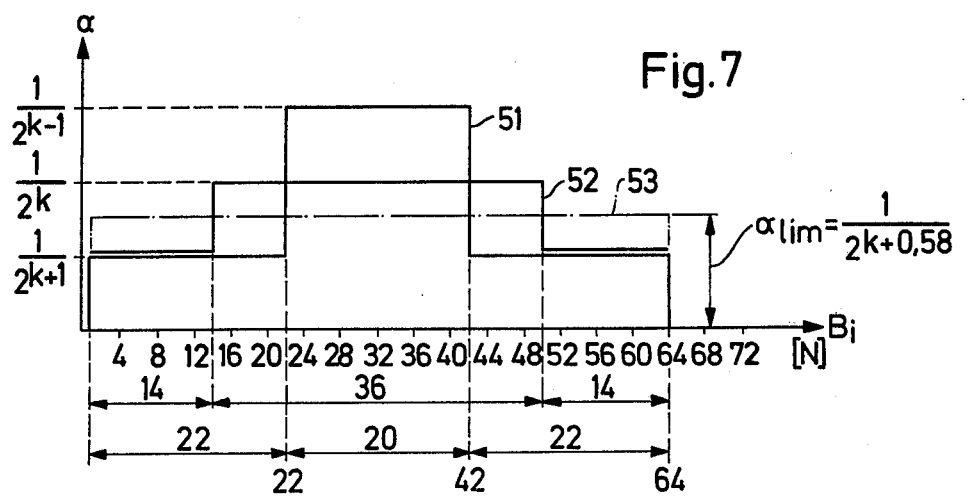

METHOD AND APPARATUS FOR ADJUSTING AND READJUSTING AN AUTOMATIC CORRECTOR FOR A DATA SIGNAL TRANSMISSION SYSTEM

FIELD OF INVENTION

The invention relates to a method of adjusting and readjusting an automatic corrector for a data signal transmission system, the corrector serving to restore pulse-amplitude-modulated signals which have suffered linear distortions in a transmission channel.

BRIEF REVIEW OF PRIOR ART

Pulse-amplitude-modulated signal sequences can be transmitted by means of a transistor and receiver in communication with one another via a transmission channel. A method of and system for automatic channel correction in connection with the transmission of such signal sequences is disclosed e.g. in Swiss Patent Specification No. 545 043 which suggests that data can be transmitted without distortion relatively fast over a channel of limited band width provided that the channel is corrected by means of a corrector so that the pulse response has equidistant zero places. Pulse responses of this kind and the associated frequency characteristics are described and shown in E. R. Kretzmer's paper "Binary Data Communication by Partial Response Transmission", 1965 IEEE Annual Commun. Conv. Conf. Rec., pages 451 – 455.

A corrector alters the spectrum S of the transmission system including the transmission channel so that one of the following conditions is met:

$$S(f) = 2 \sin \pi \frac{f}{F}$$

$$S(f) = 4 \sin^2 \pi \frac{f}{F}$$

$$S(f) = 2 \cos \frac{\pi f}{2F}$$

S denoting the spectrum in dependence upon the frequency $f$ while F denotes the signal bandwidth.

One known automatic and adaptive corrector or equalizer has a transverse filter and is used to provide thorough restoration or reconstruction of pulse-amplitude-modulated signals suffering linear distortions in the transmission channel. According to known methods, in a first adjustment phase at the start of data transmission the corrector is supplied with a signal identical to the transmitted signal so that the corrector can adjust itself to an extent such as to be able in the second adjustment phase automatically and adaptively to provide further improvement of the adjustment, by means of its already corrected output signals — i.e., to be able to compensate for variations in transmission channel characteristics.

The measure of "goodness" of accuracy of corrector adjustment is the difference between the undistorted transmitted signal and the signal restored by the corrector; such difference will hereinafter be called the "error signal". The manner in which the error signal is formed varies according to the kind of corrector used. In the case of zero forcing correctors the total pulse response is forced on a total pulse response of the ideal transmission channel having equidistant zero places. Such a corrector forms an error signal which results from the condition for equidistant zero places. In mean square error adjustment of correctors however, the error signal corresponds to the mean square difference between the ideal pulse response of the ideal transmission channel and the pulse response of the actual transmission channel, as measured at the corrector output. In both these known kinds of corrector the error signal is used to provide optimum adjustment of the corrector during the first phase of adjustment — i.e., before data transmission — and during the second phase of adjustment — i.e., during data transmission. The adjustment is effected in the form of an iterative procedure and can be made either very inaccurately but rapidly or accurately but slowly. The time yardstick is the number of iterations and the quality yardstick is the effective value of the error signal. Such correctors suffer from the disadvantage of either a long adjustment time or of inaccurate adjustment; elaborate equipment is necessary at least to obviate the first of these two disadvantages while the second results in a high error rate and high sensitivity to disturbances.

It is an object of the invention therefore to provide an improved correction method and a corrector system combining rapid and accurate adjustment of the corrector without the need to use elaborate extra equipment.

DESCRIPTION OF INVENTION

In a method according to the invention, the filter coefficients are subdivided into at least two groups and, at least during the first adjustment phase, one group of filter coefficients is calculated with a more attenuated error signal than the filter coefficients of the other group with the aim of reducing the adjustment time for the transversal filter.

In the system according to the invention, means are provided for calculating filter coefficients subdivided into at least two groups and having different attenuation factors.

LIST OF DRAWINGS

The invention will be described in greater detail hereinafter by way of example with reference to the drawings wherein:

FIG. 4 is a graph of the build-up of the filter coefficients during the first phase of adjustment, plotted against time — i.e., the number of iterations;

FIG. 5 is a graph of the values of the filter coefficients stored in the discrete stages N of the transversal filter during the second phase of adjustment;

FIG. 6 is a graph of an example of the different factors $\alpha$ used to build up the filter coefficients of FIG. 5, this particular illustration being known as an $\alpha$ profile;

FIG. 7 is a graph of three different $\alpha$ profiles for a 64-stage transversal filter;

FIG. 13a is a graph of an α-profil upon which

FIG. 13b is a graph of the behaviour of the corrector shown in FIG. 7 during the first phase of adjustment;

FIG. 14b shows a switch used in FIG. 14a.

DETAILED DESCRIPTION OF PREFERRED EMBODIMENTS OF INVENTION

Figure 1:
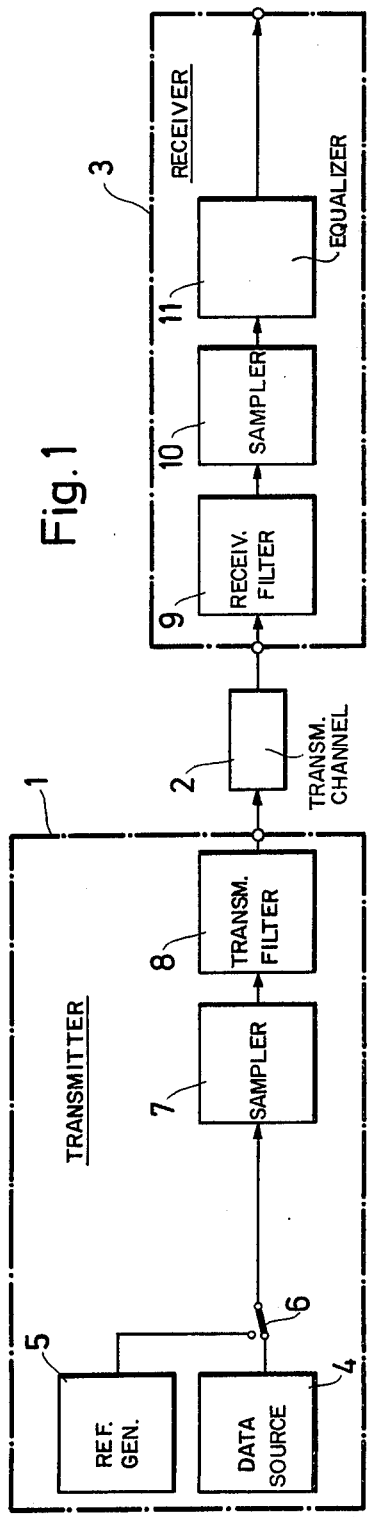
FIG. 1 is a block schematic diagram of a known binary data transmission channel.

Referring to FIG. 1, which is a block schematic diagram of a known data transmission system, pulse-amplitude-modulated signals are transmitted from a transmitter 1 over a transmission channel 2 of limited bandwith to a receiving station 3. The transmission station comprises a data source 4, a reference generator 5, a selector 6 for connecting the generator 5 to a sampler 7 during the first phase of adjustment and for connecting the data source 4 to the sampler 7 during the second phase of adjustment, and a transmission filter 8 for keeping harmonics of the sampling frequency of the sampler 7 out of the transmission channel 2. The receiving station 3 has a reception filter 9 to suppress noise signals which have been superimposed on the data signal in the transmission channel 2, a sampler 10 for sampling the output signal of the filter 9 and a corrector or equalizer 11 which receives the sampled output signal of the filter 9.

The transmission channel 2 can be any kind of telephony channel having a bandwidth of e.g. from 300 to 3400 Hz in accordance with CCITT Recommendations and can be a wired line, a carrier telephony channel, a radio channel, or a mixed channel.

Before the start of data transmission the selector 6 is connected to the output of reference generator 5 so that the sampler 7 receives a train of reference signals produced by the generator 5. The reference signal train goes through sampler 7 to a transmission filter 8 in which the time signal is given its required spectral form in the light of the Niquist criterion. The spectrum in the case of binary data transmission is a substantially rectangular one. The output signals of filter 8 pass over transmission channel 2 to reception filter 9. The output thereof is sampled by sampler 10 and the values thus sampled are applied to corrector 11. During the first phase of adjustment the corrector is adjusted by means of the reference signal sequence known to it so that the frequency pattern and transit time pattern of the complete transmission link — i.e., from the input of filter 8 to the output of corrector 11 — is constant. Since after some time the filter coefficients have been adjusted to a sufficient accuracy, the selector 6 can be connected to the output of data source 4 and the transmission of data can begin. The events occurring in the corrector will be described in greater detail hereinafter with reference to FIG. 3.

Figure 2:
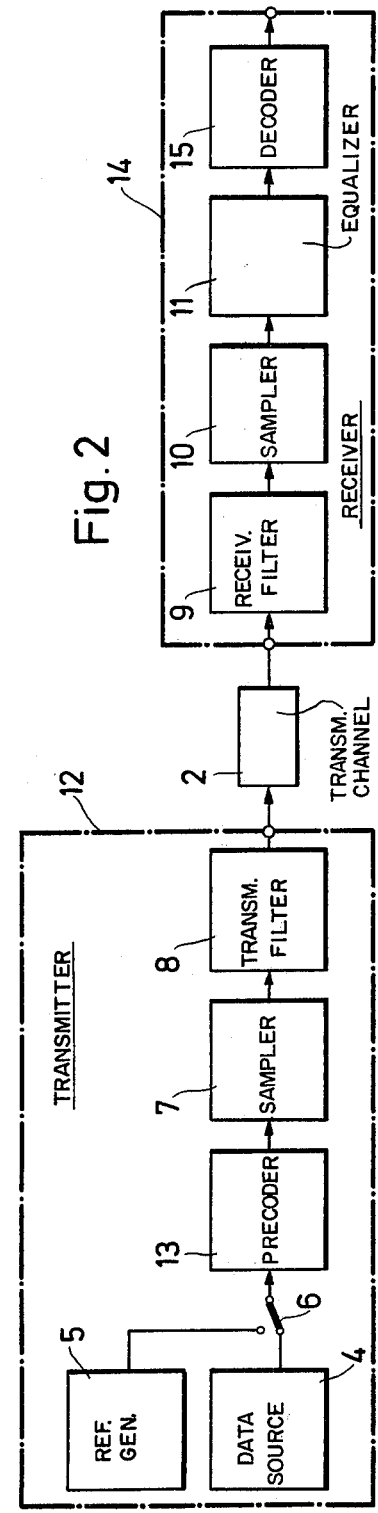
FIG. 2 is a block schematic diagram of a known data transmission system for a special category of pulse-amplitude-modulated signal sequences (partial response signal format)

FIG. 2 is a block schematic diagram of a data transmission system for the transmission of partial-response signals. Elements performing the same function as elements of the transmission system shown in FIG. 1 have the same references. The transmission facility 12 of the system of FIG. 2 comprises in addition a precoder 13 between selector 6 and sampler 7 and the receiving facility 14 has in addition a decoder 15 connected to the output of corrector 11. The transmission filter 8 is devised so that the spectrum of the signal to be transmitted is devoid of d.c. components, hence the presence of the precoder 13 and, in the receiving facility 14, of the decoder 15 in FIG. 2 and not in FIG. 1. The precoder 13 and decoder 15 prevent incorrect delay arising from disturbances in the channel 2. The corrector 11 of the receiving facility 14 of FIG. 2 is adjusted similarly to the corrector 11 of the receiving facility 3 of FIG. 1.

Figure 3:
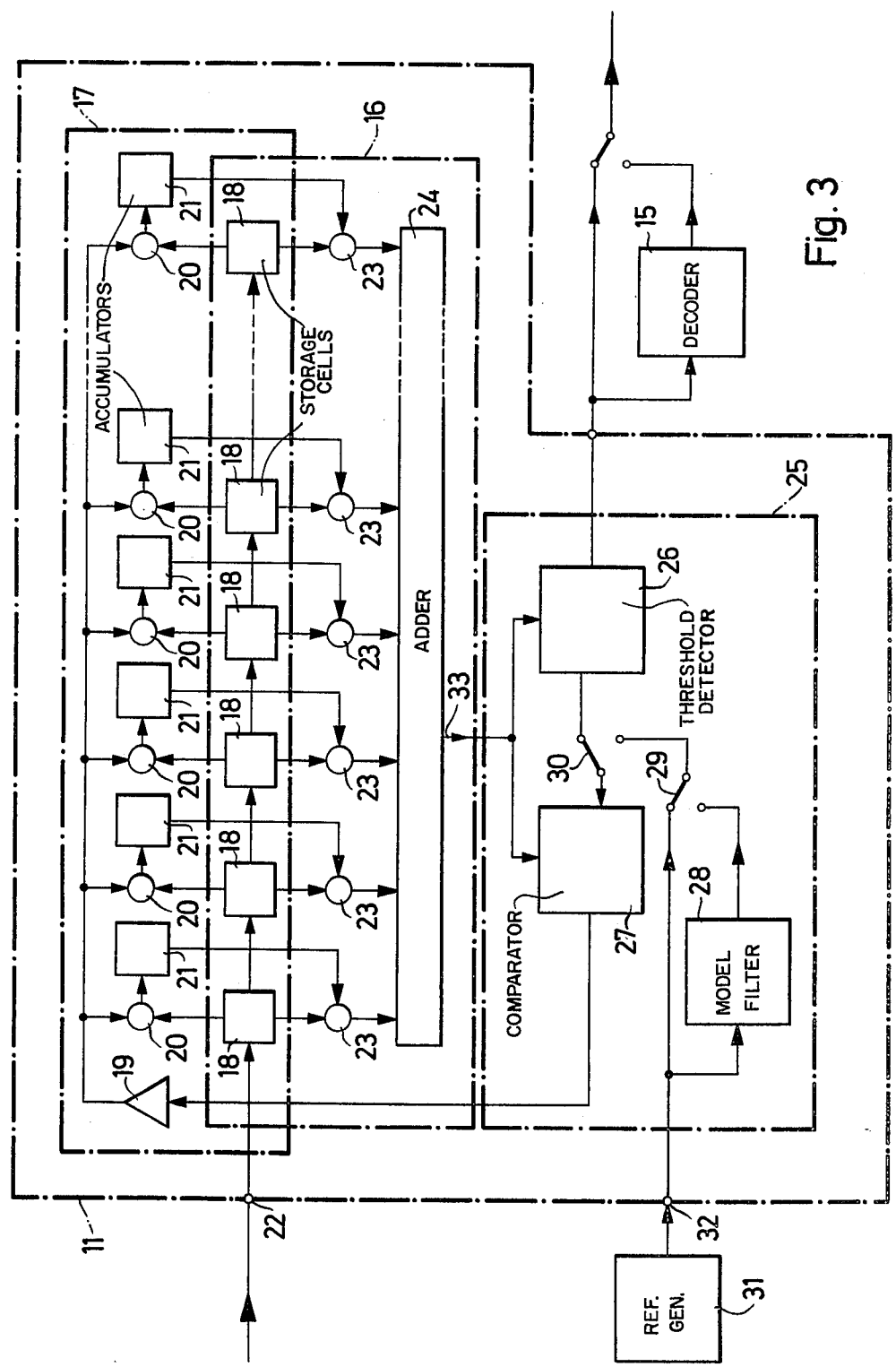
FIG. 3 is a block schematic diagram of a known corrector which uses the mean square error method and which has a transverse filter.

FIG. 3 is a simplified block schematic diagram of the known corrector 11 used in systems of the kind shown in FIGS. 1 and 2. The known corrector 11 has a transversal filter 16 and a multistage correlator 17, a delay chain which has a number of storage cells 18 being common to the filter 16 and correlator 17. The correlator 17 has, in addition to the delay chain an attenuator 19, first multipliers 20 equal in number to the number of cells 18 in the delay chain, and the number of accumulators 21. Incoming signals are supplied via an input terminal 22 to the first cell 18 of the delay chain. Each cell 18 is connected to one each of the two inputs of the first multipliers 20 and the other inputs thereof are connected to the output of the attenuator 19. The filter 16 comprises, in addition to the delay chain, second multipliers 23 corresponding to the number of cells 18 and connected one each to one each of the cells 18, and an adder 24 connected to all the outputs of the second multipliers 23. The corrector 11 also comprises an error signal generator 25 comprising a threshold detector 26, an comparator 27, a model filter 28 and two selectors 29, 30.

At the start of the first adjustment phase — i.e., immediately before the transmission of data — a reference signal sequence produced by the reference generator 5 is, as previously mentioned, transmitted from the transmitter 1 or 12 over the channel 2 to the receiver 3 or 14 and the incoming reference signal is supplied to the corrector input terminal 22. Simultaneously, an identical reference signal produced by a reference generator 31 of the receiver 3 or 14 is supplied to another input terminal 32 of corrector 11. Through the agency of synchronizing means (not shown) of two reference generators 5, 31 are started so that the reference signal associated with the input terminal 32 arrives a few sampling intervals later than the reference signal associated with the input terminal 22.

While the reference signal transmitted over channel 2 is being supplied to the first storage cell 18 of the delay chain which takes the form of a shift register, the reference signal produced by the reference generator 31 is supplied by way of modeling filter 28 and selectors 29 and 30 — which are in their "not-shown" position during the first adjustment phase — to the comparator 27. During the first phase of adjustment the compensation for the frequency pattern of the filters 8 and 9, is provided by means of the filter 28 such compensation being necessary to discover the pulse response of the channel 2. The pulse response thereof is devised so that the reference signal produced by the reference generator 31 corresponds to a reference signal transmitted from the transmitter 1 or 12 to the receiver 3 or 14 over an ideal transmission channel. The correlation between the self-produced or "local" reference signal and the received reference signal, the latter being identical to the local reference signal except for transmission channel influences, is a measure of the pulse response of the channel 2. Correlations between the received reference sequence and the locally produced reference sequence are made at discrete instants of time which are determined by the shift register type delay chain in a manner not shown (sic) in FIG. 3. At each of such instants the instantaneous values of the two reference signal sequences are supplied from the particular storage cell 18 concerned, and from the output of the comparator 27 via the attenuator 19, to the inputs of the associated multiplier 20 and are multiplied with one another therein. The products formed are added and stored in the accumulators 21. Correlation signals corresponding to the correlation factors, hereinafter called filter coefficients, can be derived at the outputs of the accumulators 21. Each output signal thereof is supplied to the associated second multiplier 23, so that the adder 24 multiplies each individual value stored in the cells 18 with the particular filter coefficient concerned, adds, and produces a sum signal at its output 23. The sum signal goes to the comparator 27 and threshold detector 26. During the first phase of adjustment the detector 26 is not connected to the comparator 27 and is therefore inoperative. At the start of the first adjustment phase the filter-coefficient values stored in the accumulators 21 are e.g., zero to start with, and so the sum signal is zero. The filter coefficients build up gradually and continuously during the first adjustment phase until the adjustment of the corrector corresponds to the pulse response of the channel 2. Once this state of adjustment has approximately been reached, the selectors 29, 30 are moved into the position shown in FIG. 3 and the selector 6 of the transmitter 1 or 12 is simultaneously moved into the position shown in FIGS. 1 and 2 respectively so that data transmission proper can begin.

A description will now be given in greater detail of how the corrector shown in FIG. 3 operates. The sensed or detected value $j$ is being processed in the corrector at a particular instant of time. The shift register formed by the cells 18 contains $j = 1$ to N sensed or detected values Ai and the accumulators 21 contain the same number of values of filter coefficients Bi. A purely formal calculation is made, by means of the multipliers 26 and adder 24, of the value of the sum signal:

$$Zj = \sum_{i=1}^{N_1} Aji\, Bji \qquad (1)$$

the sum signal Zj is supplied to comparator 27 and threshold detector 26. The function of the threshold detector 26 is to decide whether, in the case of binary data transmission, a 0 or 1 was transmitted. If the threshold detector 26 has made the correct decision, a reference signal zj corresponding to the signal transmitted by the transmitter 1 is available at the output of threshold detector 26. The difference between the reference signal zj and the sum signal Zj is formed in the comparator 27 so that the same outputs an error signal:

$$Fj = zj - Zj \qquad (2)$$

The error signal Fj goes through attenuator 19 to all the multipliers 24 of the correlator 17 in which all the signal values stored in the cells 18 are multiplied in the multipliers 20 with the error signal Fj attenuated by the attenuation factor $\alpha$, the product being the correction value:

$$\Delta Bji = \alpha Fj\, Aji \qquad (3)$$

of the error coefficients Bi. The correction values $\Delta Bji$ already stored therein, the corrected filter coefficients being formed in accordance with the equation:

$$Bj+1,i = Bji + \Delta Bji \qquad (4)$$

Computation is therefore at an end and is restarted by the write-in of a new sampled value into the shift register when the sampled value stored in the last cell 18 of the shift register is ejected therefrom. Calculation of the next output value $Zj+1$ starts with formula (1) and terminates with the correction of the filter coefficients in accordance with formula (4).

As will be clear from the foregoing, the filter coefficients first have to be built up at the start of the first adjustment phase, since until they are built up all the filter coefficients Bi are zero an so the sum signal Zj at the adder output 33 is zero. The threshold detector 26 cannot reach any decision about the value of the transmitted signal. During the first phase of adjustment, therefore, the comparator 27 receives via the selector 30 the reference signal sequence produced by the local reference generator 31 which produces a reference signal sequence identical to the reference signal sequence produced at the transmitting end (reference generator 5). Consequently, the reference signal sequence arriving at the corrector input 22 corresponds to the locally produced reference signal sequence, except that the sequence which has travelled over the transmission channel has experienced linear distortions because of the channel 2 and, as a rule, reaches the corrector input 22 sooner than the locally produced sequence reaches the input 32. Since the sampled values are supplied to the input of the cell type shift register, this time stagger or offset cancels out for a particular cell, and it is in such a place that correlation between the local sequence and the received sequence is usually at a maximum, so that the maximum filter coefficient builds up in the associated accumulator 21. The remaining filter coefficients build up in accordance with distortions caused by channel 2 so that the mean square value of the error signal at the output of comparator 27 tends to a minimum. When such error signal is so small that the threshold detector 26 can give a correct majority decision in the case of binary signals values that:

$$Zj > 0 \rightarrow zj = +1 \quad Zj < U \rightarrow zj = -1 \qquad (5)$$

the selector 30 can be changed over to the output of detector 26. Once selector 30 has been changed over to the position shown in FIG. 3, the corrector is in the second phase of adjustment during which data transmission can proceed. The data signal sequence corrected by the corrector is itself used, by way of the threshold detector 26, as reference signal sequence and the corrector can thereafter adapt itself continuously to variations in the transmission characteristics of the channel 2.

To reduce start-up times — i.e., to ensure that the first phases of adjustment are very short — the attenuation factor $\alpha$ in the attenuator 19 is usually very large. The filter coefficients Bi then build up rapidly since the corrections $\Delta Bi$ per sample value are large. FIG. 4 is a graph showing the formation of a filter coefficient Bi, the value of the filter coefficient being plotted along the ordinate and the number of samplings $j$ being plotted along the abscissa. Clearly, the optimum value Bopt is achieved after a relatively small number of sampling, e.g., — after as a few as 20 samplings in the example shown. The disadvantage here, however, is that the value of the filter coefficients Bi oscillate continuously around the ideal final value $B_{opt}$. The sum signal Zj is formed in accordance with formula (1) therefore becomes correspondingly inaccurate, with the result that, in accordance with formula (2), a large error signal Fj is produced. The error signal is relatively large more particularly because the sum signal calculated from formula (1) contains errors arising from N inaccurate filter coefficients Bi. Clearly, therefore, the errors contained in the sum signal Zj are larger in proportion as the shift register of the corrector 11 has more cells 18 when a particular attenuation factor $\alpha$ is used, N being equal to the number of cells 19 or of the filter coefficients. If the attenuation factor $\alpha$ is too large, the system may even become unstable.

FIG. 5 is a graph showing the filter coefficients Bi stored in the accumulators 21 associated with the storage cells 1 to N. As will be apparent, the filter coefficients stored in the accumulators 21 associated with the first and last cells 18 are, as a rule, small in comparison with those stored in the accumulators associated with the central cells. If all the filter coefficients Bi are calculated with a particular constant attenuation factor $\alpha$, the relative inaccuracy of the newly calculated filter coefficients stored in the accumulators 21 near the beginning and end of the row of cells 18 increases. The increase in the relative inaccuracy of the "marginals" — i.e., of the first filter coefficient $B_1$ and the last filter coefficient $B_N$ can become such that the coefficients $B_1$ and $B_N$ cease to make any contribution to correction and merely add an unwanted noise component to the sum signal Zj.

To obviate these disadvantages, the attenuation factor $\alpha$ can be chosen as small as required with a resultant increase in the relative accuracy of the filter coefficients Bi and a greatly reduced risk of instability. However, the disadvantage of a small attenuation factor $\alpha$ is that the adjustment time becomes long since the formation of the filter coefficients of FIG. 3 proceeds only on the basis of small increments per sampled value $j$; it therefore takes considerably longer for the filter coefficients to form.

Figure 8:
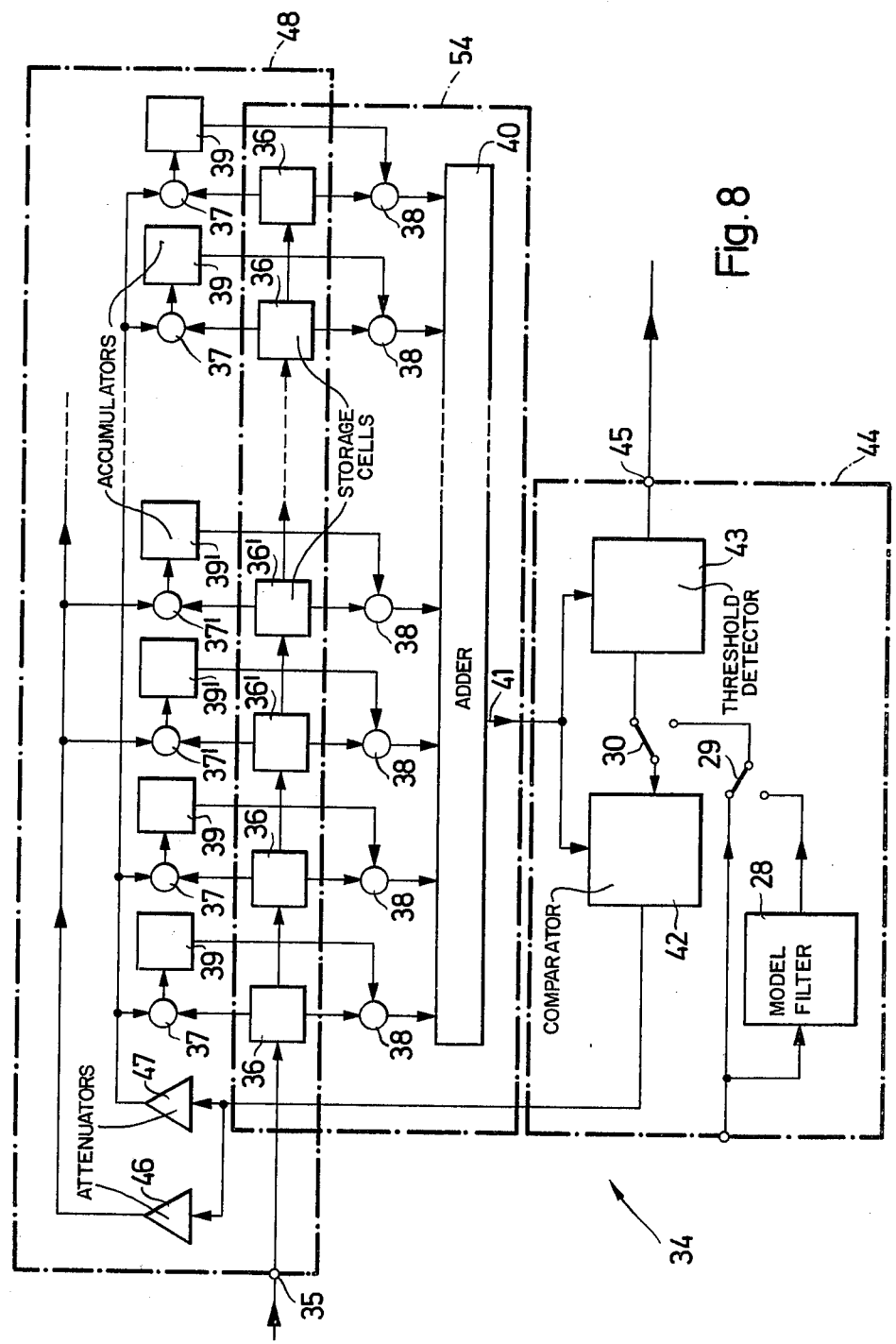
FIG. 8 is a block schematic diagram of a simple embodiment of a corrector in accordance with the invention.

The disadvantages hereinbefore mentioned are obviated in the modified corrector 34 shown in FIG. 8. The values sampled by the sampler 10 of the receiver 3 (FIG. 1) or 14 (FIG. 2) pass sequentially in time through an input 35 to a first storage cell 36 of a shift register having N such cells. Each cell 36 supplies the sampled value in it to a first multiplier 37 and to a second multiplier 38. The output of each first multiplier 37 resp. 37' is connected to an accumulator 39 resp. 39' whose output is connected to the associated second multiplier 38. All the outputs of the second multipliers 38 are connected to an adder 40 of the transversal filter 54 which forms by fold-over the sum signal Zj, the same appearing at output 41 of adder 40. The latter signal goes to an comparator 42 and to a threshold detector 43 of an error signal generator 44 of identical construction to like element 25 of the corrector 11 of FIG. 3. One output of detector 43 is connected to an output terminal 45 of corrector 34, and the received data signals can be sampled at the terminal 45. The output of compartor 42 is connected to two attenuators 46, 47 of correlator 48.

The two attenuators 46, 47 have different attenuation factors $\alpha_1$, $\alpha_2$. The attenuator 47 having the lower factor $\alpha_1$ is connected to the inputs of the first multipliers 37 associated with the first and last cells 36 of the shift register, whereas the attenuator 46 having the high attenuation factor $\alpha_2$ is connected to the first inputs of the first multipliers 37' associated wtih the central cells 36' of the shift register. As will be described hereinafter, the use of at least two attenuators makes it possible to process the high and low filter coefficients Bi differently.

As a rule, the choice of the correction step value $\Delta$Bi is made in accordance with the criteria of stability conditions. According to the paper by G. Ungerboeck "A Theory on the Convergence Process in Adaptive Equalizers", published on the occasion of the International Communications Conference in Philadelphia, 19 – 21 June 1972, it is known that, for a constant value of a correction step, there is a maximum limit for the attenuation factor, and beyond that limit the system becomes unstable. This limited attenuation factor is given by:

$$a_o \leq a_{lim} = \frac{2}{TR(A)} \tag{6}$$

in which the term TR(A) denotes the sum of the diagonal elements of the autocorrelation matrix of the input signal. If an attenuation profile by the factor $L<1$ is introduced, then for a corrector having the variable correction step value $\Delta$Bi:

$$a_o \leq a_{lim} = \frac{2}{TR(A)} \frac{N L_{(i=m)}}{\sum_{i=1}^{N} L^{i^2}} \tag{7}$$

($i = m$) denoting the place where the largest filter coefficient occurs. In this case the limit of stability, given by $\alpha_{lim}$, is higher than for a constant correction step value since the second fraction in formula (7) has a value greater than 1. This feature leads to the great advantage that the higher filter coefficients (see FIG. 5), which are determining factors for the value of the error signal Fj, can be provided by means of a correction step which is larger than the other filter coefficients. The means for providing this different processing of high and low filter coefficients is the attenuation profile, hereinafter called the $\alpha$profile. An example of such a stepped $\alpha$ profile is indicated by the solid-line curve 49 in FIG. 6, the chain-line curve 50 representing a continuous $\alpha$ profile. To embody such a continuous $\alpha$ profile, separate attenuators 46, 47 each having an individual attenuation factor $\alpha$ would have to be associated with each of the first multipliers 37 of the corrector 34 of FIG. 8. However, embodying a corrector of such a kind is very elaborate since e.g., two N multipliers and a very large number of attenuators are necessary.

Experiments have shown that very satisfactory results can be achieved by using stepped $\alpha$ profiles instead of a continuous $\alpha$ profile. A stepped $\alpha$ profile, with the value of the attenuation factor $\alpha$ varying the factor of 2 between consecutive stages, is very advantageous as regards reduction in circuit complexity, more particularly for correctors having digital computer networks. A value in binary code can be halved or doubled by a simple shift by one place, to be described in greater detail hereinafter. To explain formulas (6) and (7), an example is given in FIG. 7 of two possible $\alpha$ profiles. The graph of FIG. 7 relates to a corrector having 64 storage cells and the same number of filter coefficients which are stored in the associated accumulators. The place $m$ where the largest filter coefficient occurs is in the centre — i.e., at $N/2$.

In the case of the first $\alpha$ profile, represented by curve 51, the attenuation factor $\alpha$ for the middle 20 filter coefficients Bi is $(23-42)\frac{1}{2}^{k-1}$, whereas for the first 22 and the last 22 filter coefficients the attenuation factor $\alpha$ is $\frac{1}{2}^{k+1}$.

In the case of the second $\alpha$ profile, represented by a curve 52, the attentuation factor $\alpha$ for the middle 36 filter coefficients Bi(15–50) is $\frac{1}{2}^k$, and the attenuation factor $\alpha$ for the first 14 and the last 14 filter coefficient Bi is $\frac{1}{2}^{k+1}$.

If constant attenuation factor were to be used for all the filter coefficients Bi, according to Ungerboeck at most $\alpha_{lim} = \frac{1}{2}^{k+0.58}$ could be used. This constant attenuation factor $\alpha_{lim}$ is represented by FIG. 7 by a chain-dotted straight line 53. The value of the factor $\alpha_{lim}$ is between the values $\frac{1}{2}^k$ and $\frac{1}{2}^{k+1}$ and corresponds to the attenuation factor which can be calculated from the formula (6). In the case of the $\alpha$ profile represented by the curve 52, $\alpha_{max} = \frac{1}{2}^k$ and is therefore $2^{0.58} \simeq 1.5$ times greater than $\alpha_{lim}$; for the $\alpha$ profile represented by the curve 51, $\alpha_{max} = \frac{1}{2}^{k+1}$—i.e., $2^{1.58} \simeq 3$ times higher than $\alpha_{lim}$. Very many other profiles, e.g., having three steps and an assymetric distribution, are possible in addition to the $\alpha$ profiles shown in FIG. 5.

Figure 9:
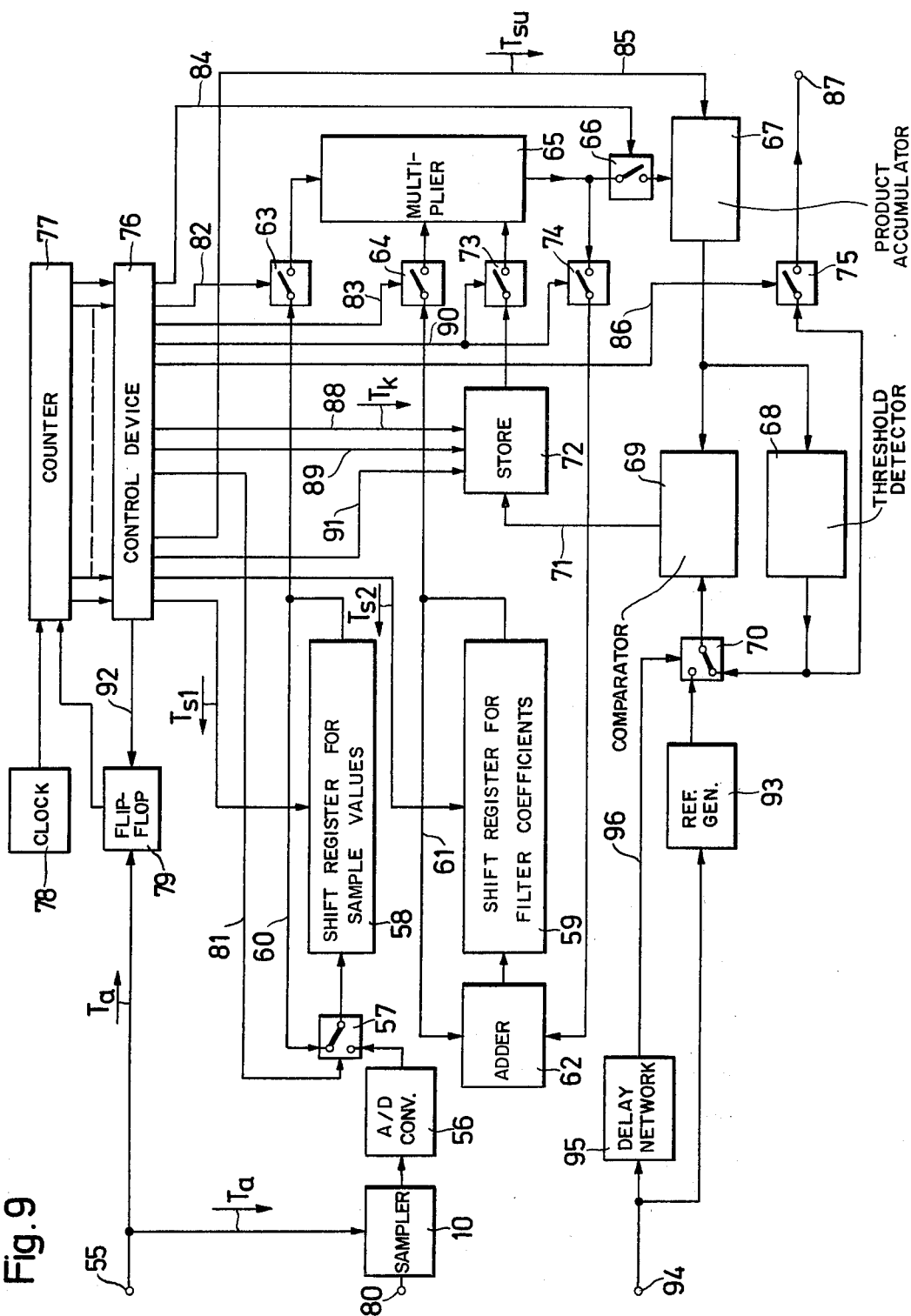
FIG. 9 is a block schematic diagram of a digital embodiment of a corrector in accordance with the invention.

The rapid calculating speed of digital circuits makes it possible to make the calculations in accordance with formulas (1) to (4) sequentially, leading to an embodiment of a corrector as shown in FIG. 9 which processes the filter coefficients in accordance with an $\alpha$ profile. The received reference signal sequence or data signals is or are sampled by means of the sampler 10. The sampled values are supplied to an analog-to-digital converter 56 at the rhythm of timing signals Ta supplied via an input 55. The converter 56 converts each sampled value into a multiplace binary word which, by way of a selector 57 when the same is in a position not shown in FIG. 9, is written into an N-place shift register 58 storing N binary sensed values. Register 58 corresponds to some extent to the consecutive cells 36 of the corrector 34 of FIG. 8. N binary words correspond to N filter coefficients Bi are stored in another N-place shift register 59. The output of shift register 58 can be connected, via a feedback loop 60 and the selector 57, to the input of register 58, for circulation of the stored binary sampled values.

The input of the other shift register 59 can be connected via a feedback loop 61 and an appropriate adder 62 to the input of the other shift register 59, for circulation of the stored binary filter coefficients. The outputs of the two shift registers 58, 59 are connected one each to a switch 63, 64 which during the synchronous circulation of the data stored in the shift registers are in the closed state, so that a binary sampled value and a filter coefficient pass sequentially in time to a single multiplier 65, the "sampled value times filter coefficient" product being formed in the multiplier 65 at each shift timing signal supplied to the shift registers 58, 59. When the partial result appears at the output of multiplier 65, a switch 66 closes so that the partial results enter a product accumulator 67. After one circulation of the contents of the registers 58, 59, the value Zj of the formula (1) is available at the output of product accumulator 67 and is supplied to a threshold detector 68 and an comparator 69. The function of the threshold detector 68 in the second phase of adjustment is to form the accurate reference value zJ from the inaccurate value Zj. The reference value zj is supplied via a selector 70 to another input of comparator 69 so that the same can form the error signal Fj in accordance with formula (2). The error signal passes through a line 71 to a store 72 in the form of a shift register whose contents can be shifted forwards and backwards. An embodiment of such a store will be described in greater detail hereinafter with reference to FIG. 14. The function of store 72 is to attenuate the binary error signal Fj by a selectable factor $\alpha$ — i.e., the product $\alpha_1 Fj$ is formed with $\alpha = \frac{1}{2}^{kl}$. Store 72 can also be connected to multiplier 65 via a switch 73. After the error signal which has been newly calculated by comparator 69 and attenuated by the factor $\alpha$ has been stored in store 72, the binary values stored in register 58 are circulated again, and during the time that they are circulating the switches 63, 73 and another switch 74 which connects the output of multiplier 65 to another input of adder 62 are in the closed state. At each shift timing signal supplied to the two shift registers 58, 59, the multiplier 65 receives the samples values Aji via the switch 63 and, via the switch 73 and in the first place, the error signal Fji attenuated by the attenuation factor $\alpha_1$. The multiplier 65 acts in accordance with formula (3) to calculate the correction valve $\Delta Bji = \alpha_1 Fji Aji$, which passes through switch 74 to adder 62. The same is also supplied, via feedback loop 61, with the filter coefficients appearing at the output of shift register 59, so that the adder 62 can correct one filter coefficient after the other in accordance with formula (4). After an initial number of filter coefficients have been corrected, the value $\alpha_1 Fj$ contained in store 72 can be shifted by one or more places increasing the value stored therein to form the value $\alpha_2 Fj$ with $\alpha_2 = \frac{1}{2}^{k+n}$, n denoting the number of correction shift timings supplied to the store 73. A second bath of filter coefficients can be corrected in the same way by correction valves having a different attenuation factor. A shift of $m$ steps in the store 72 reducing the value stored therein enables an attenuation factor of $\alpha_3 = \frac{1}{2}^{k-n+m}$ to be formed for other filter coefficients. Correction is complete when all the filter coefficients have been given a correction and have been re-stored in their original position with regard to their serial index $i$ in the register 58 and are available for further use. Clearly, the store 72 can be used to provide any desired $\alpha$ profile stepped in factors of 2 in quite a simple manner.

A control mechanism 76 provides the control signals required to control the switches 63, 64, 66, 73, 74 and the product accumulator 67, the shift timing signals $Ts_1$ and $Ts_2$ for the shift registers 58, 59, the correction timing signals Tk for the store 72 and a control signal for an output switch 75. Mechanism 76 in turn receives corresponding time-staggered instructions from a computing-step counter 77 which receives timing signals produced by a timing generator 78 to ensure proper observation of program times.

The sampling timing signal Ta supplied via input terminal 55 to sampler 10 also goes to a bistable circuit 79 which is set by every sampling signal; bistable circuit 79 provides an output signal which is supplied to the counter 77 so that the same can start to produce the instructions for the mechanism 76. When the mechanism 76 has ended the program, bistable circuit 79 is reset via a line 92, with the result that the counter 77 stops. The program re-starts upon the arrival of the next signal Ta.

Figure 10:
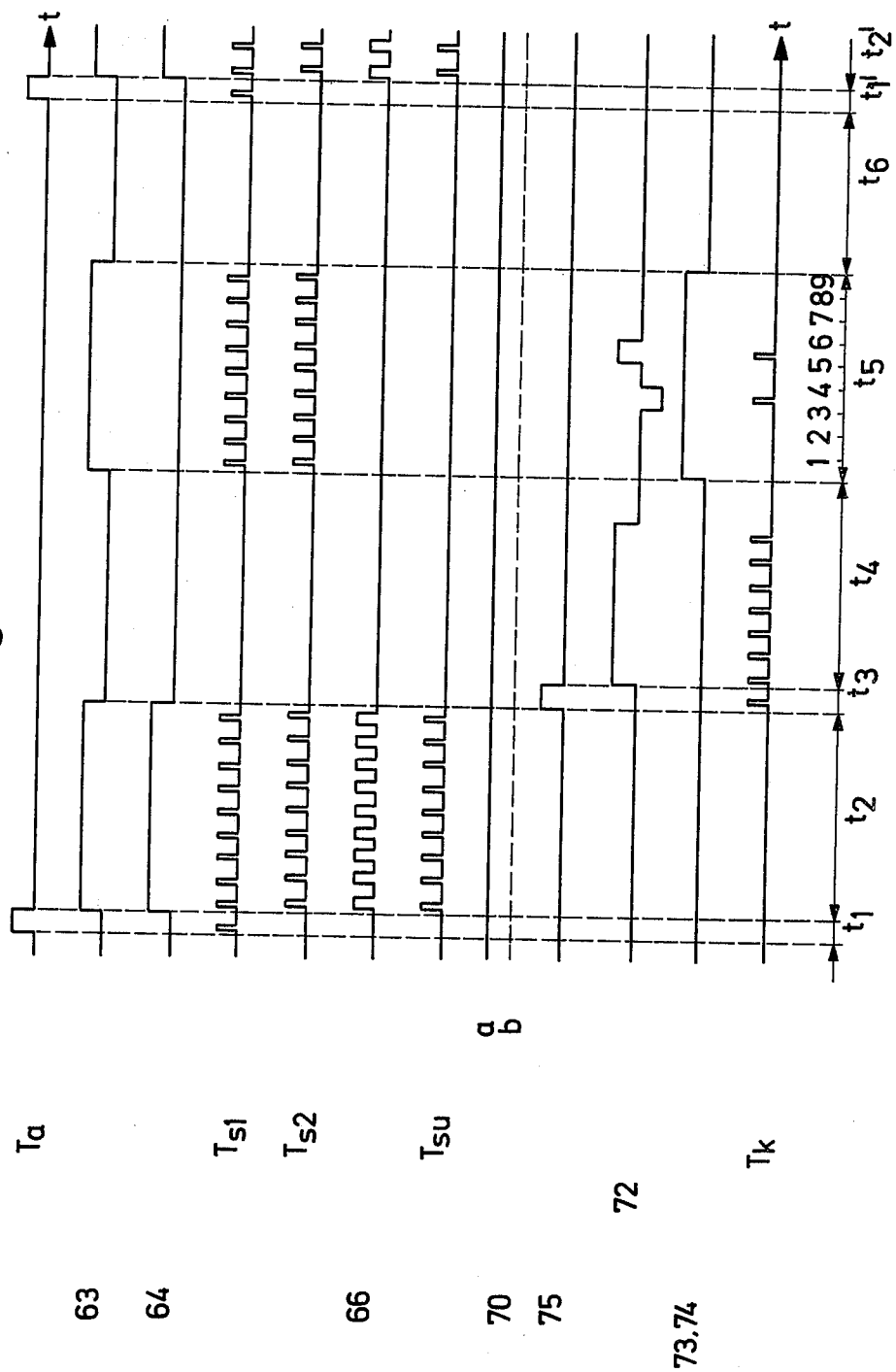
FIG. 10 shows pulse diagrams for controlling the corrector of FIG. 9.

The events just described will be described individually in greater detail hereinafter with reference to FIGS. 9 and 10. FIG. 10 is a graph of the times of occurrence of the various timing signals and the states of the switches hereinbefore referred to and mainly covers the time elapsing between the occurrence of two sampling timing signals Ta, the corrector of FIG. 9 being in the second phase of adjustment in which the received data signals are present at input terminal 80 connected to detector 10 and selector 70 is in the position shown in FIG. 9. Selectors 57, 70 and switches 63, 64, 66, 73 – 75 are not conventional switches but are electronic switches which respond very rapidly to control signals applied to them. The time between the appearance of the leading edges of the first and second sampling timing signals Ta is subdivided into portions $t_1$ and $t_6$.

Portion $t_1$ is bounded by the leading edge and trailing edge to signal Ta. During this period or portion $t_1$ the sampler 10 samples the received data signal. The sample value appearing at the output of sampler 10 is converted into the binary word in the analog-to-digital converter 56 and is supplied, via selector 57 — which changes over briefly into the position not shown in FIG. 11 upon the arrival of the first timing signal Tsl in the shift register 58 — to the latter and is stored in the first stage thereof; the sample value in the last stage of register 58 is available on the loop 60, but because at this time the selector 57 has been changed over and the switch 63 is open this value is lost. However, the register 58 has taken over the new sample value. The signal Ta has also been supplied to bistable circuit 79 and the same has started counter 77 so that the mechanism 76 produces the first shift timing signal Tsl for the shift register 58, plus a brief control signal which goes via a line 81 to selector 57.

During the second portion $t_2$, the switches 63, 64 receive control signals via lines 82, 83 respectively and therefore are in the closed state during the second portion $t_2$. Each of the two registers 58, 59 receives 9 shift timing signals Tsp, Ts2 respectively; consequently, the information stored in the two registers 58, 59 makes one circulation via the respective loops 60, 61. To simplify the illustration in graph form, it has been assumed that the shift registers each have 9 stages. In fact, the registers 58, 59 preferably have 32 and 64 stages. Consequently, during the period or portion $t_2$ the shift registers must be supplied not with just 9 shift timing signals but each with 32 and 64 such signals, respectively, for a single circulation of the stored information. Each individual value Aji appearing at the output of register 58, and each filter coefficient Bji appearing simultaneously at the output of register 59, go through the closed switches 63, 64 respectively to multiplier 65 which forms a discrete product Aji.Bji at each signal Ts1, Ts2. During the period $t_2$ switch 66 receives via line 84 control signals produced by mechaism 76, so that the discrete products appearing at the output of multiplier 65 are entered consecutively into the product accumulator 67 for the calculation of:

$$Zj = \sum_{I}^{9} Aji\, Bji \tag{8}$$

at the frequency of an adding timing signal Tsu supplied to accumulator 67 via a line 85. After all the information stored in the registers 58, 59 has made one circulation and the accumulator 67 has calculated the value Zj, the period of portion $T_2$ terminates — i.e., switches 63, 64 open and no further signals Ts are supplied to registers 58, 59.

The length of the period or portion $t_3$ is determined by a control signal which is supplied via a line 86 to switch 75 to close the same briefly. During the period $t_3$ the sum signal Zj at the output of accumulator 67 goes to comparator 69 and to threshold detector 68. The same outputs the reference signal zj which goes via selector 70 to adder 69, for calculation of the error signal Fj, and which also goes, via switch 75 which is in the closed state during the period $T_3$, to output terminal 87 of the corrector shown in FIG. 9. The calculated error signal Fj = zj = Zj is available at the output of comparator 69 and, is written into store 72 via line 71 upon store 72 receiving a write-in timing signal via line 88. The latter signal is the first signal of a sequence of correction signals Tk which are supplied to store 72 during the next period or portion $t_4$. During period $t_3$ the reference signal zj is formed from the sum Zj and is available as an output terminal 87, while the error signal Fj is calculated from the sum signal Zj and the reference signal zj and introduced into store 72.

During period $t_4$ the error signal Fj in the store 72 is attenuated by the factor $\alpha_1 = \frac{1}{2}^7$ by 7 correction signals Tk being supplied to store 72. The operation thereof will be described in greater detail hereinafter with reference to FIG. 14. For the error signal to be attenuated, store 72 must receive a control signal via line 89 so that the stored error signal value is shifted forwards. Period $t_4$ ends with the appearance of a control signal received by the two switches 73, 74 via line 90.

The next period or portion $t_5$ is used to calculate the corrections of the filter coefficients Bi stored in the register 59 on the basis of an $\alpha$ profile. Accordingly, the switches 63, 73, 74 are in the closed state during period $t_5$ and each of the two registers 58, 59 receives shift timing signals Ts1, Ts2, respectively, of a number corresponding to the number of stages of the respective registers; consequently, the stored sample values and the stored filter coefficients are given a further circulation.

For a better understanding of the events occurring during the period $t_5$, the same has been subdivided into 9 subsections $t_{5,1}$ to $t_{5,9}$, the number of subsections being the same as the number of stages of the shift registers. A filter coefficient is re-calculated during each such subsection. During subsection $t_{5,1}$ the multiplier 65 is supplied via switch 63 with the sample value A1 and via switch 73 with the error signal Fj which has been attenuated by the factor $\alpha_1$ in the store 72, and multiplier 65 calculates the correction value:

$$\Delta Bj1 = (\alpha_1 Fj)\, Al = \tfrac{1}{2}^7 Fj\, Al. \tag{9}$$

The value $\Delta Bj1$ then goes through switch 74 to adder 62 and is added therein to the filter coefficient Bj1, so that the input of shift register 59 then receives the corrected value:

$$Bj+1,1 = Bj1 + \Delta Bj1 \tag{10}$$

Upon the arrival of the first shift timing signal Ts2, which occurs during the subsection $t_{5,1}$, the corrected filter coefficient is written into register 59. Simultaneously the next filter coefficient Bj2 appears at the output and the next sample value A2 is being prepared at the output of shift register 58, so that correction of the second filter coefficient Bj2 can proceed in the manner hereinbefore described during subsection $t_{5,2}$. In the embodiment shown in FIG. 10 the first three filter coefficients Bj1, Bj2, Bj3 are re-formed by calculation of the correction value with the attenuation factor $\alpha_1$.

During the fourth subsection $t_{5,4}$ the store 72 receives via a line 91 a control signal which so adjusts the store 72 that, when the correction signal Tk arrives via line 88, the value $\alpha_1$ Fj stored in store 72 is doubled. Consequently, an attenuation factor $\alpha_2$ which is twice the factor $\alpha_1$ is used for the correction of the filter coefficient Bj4. The correction value for the fourth filter coefficient is:

$$\Delta Bj4 = (\alpha_2 Fj) A4, \tag{11}$$

in which $\alpha_2 = 2\alpha_1 = \frac{1}{2}^6$.

During subsection $t_{5,5}$ the store 72 receives no control signal nor correction timing signal, so that the correction signal for the fifth filter coefficient is:

$$\Delta Bj5 = (\alpha_2 Fj) A5 \tag{12}$$

$\alpha_2$ remaining unchanged.

During subsection $t_{5,6}$ store 72 receives via line 89 a control signal which prepares store 72 so that, upon the arrival of another correction signal tk during subsection $t_{5,6}$ the stored value $\alpha_2 \times$ Fj is halved. Consequently an $\alpha$-factor which is half $\alpha_2$ i.e., the original $\alpha_1$ is used for correction of the sixth filter coefficient Bj6.

The store receives neither a control signal nor a correction timing signal during the remaining subsections $t_{5,7}$, $t_{5,8}$ and $t_{5,9}$, so that the remaining filter coefficients Bj7, Bj8 and Bj9 are corrected by the same attenuation factor $\alpha_1$ as is used to correct the filter coefficients Bj1, Bj2 and Bj3.

The $\alpha$ profile of simplified embodiment described with reference to FIG. 1 is two-stage and assymetrical. To correct the filter coefficients 1-3 and 6-9 the attenuation factor used is $\alpha_1 = \frac{1}{2}^7$ and to correct the filter coefficients 4 and 5 the attenuation factor used is $\alpha_2 = \frac{1}{2}^6$. By the introduction of other correction timing signals Tk and corresponding forwards and backwards shifting of the information stored in the store 72 during the time $t_5$, $\alpha$ profiles of any shape can be provided.

Period $t_5$ ends, and period $t_6$ begins, when the switches 63, 73, 74 open. At the transition from period $t_5$ to period $t_6$ the mechanism 76 produces a resetting signal (not shown) which is supplied via line 92 to bistable circuit 79. The counter 77 therefore stops and is reset to its initial position. No further computations are made during the period $t_6$. The corrector is in its normal state until a fresh sample timing signal Ta appears at input 55, to initiate another period $t_1'$, the event just described repeating whenever a new sample timing signal arrives.

A description has been given in the foregoing of correction of the filter coefficients during the second ajustment phase of the corrector. The build-up of the filter coefficients proceeds similarly during the first adjustment phase, with the difference that the adder receives not the reference values determined by the threshold detector 68 but the reference signal sequence produced by a reference generator 80, while the input terminal 80 — i.e., the sampler 10, — receives the reference signal sequence transmitted from the transmitter via the channel 2. At the start of the first phase of adjustment a synchronizing input 94 of the correction shown in FIG. 9 receives from a synchronizer (not shown) a signal which starts reference generator 93 and which also goes to a delay network 95. The same produces a delayed control signal which is supplied via line 96 to selector 70 throughout the whole of the first adjustment phase, the delay network 95 changing the selector 70 over into the position which is not shown in FIG. 9 after the reference generator 93 has started. Preferably, means (not shown) inhibit operation of switch 75 during the first adjustment phase to ensure that undefined signals do not appear at output 87.

Theoretically, there are three possible ways of calculating the correction valve $\Delta Bji$ for the filter coefficients in accordance with formula (3):

$$\begin{aligned}\Delta Bji &= (\alpha Fj) Aji, \text{ or} \\ \Delta Bji &= Fj (\alpha Aji) \text{ or} \\ \Delta Bji &= \alpha (Fj Aji).\end{aligned} \tag{13}$$

The corrector described with reference to FIG. 9 operates in the first way, the corrector to be described hereinafter with reference to FIG. 11 operates in the second way and the corrector to be described further on with reference to FIG. 12 operates in the third way.

The corrector shown in FIG. 11 has by and large the same advantages as the corrector shown in FIG. 9, and so a description will be given only of the differences between the two correctors. The output of comparator 69 is directly connected via line 97 to switch 73 so that the error signal Fj can reach the multiplier 65 without any attenuation. The output of shift register 58, in addition to being connected to selector 57 and switch 63, is also connected to the input of a store 98 which is similar to the store 72 of the corrector of FIG. 9. The output of store 98 can be connected via another switch 95 to multiplier 65.

During period $t_2$ the switches 63, 64 are in the closed state so that the discrete products Aji, Bji appear consecutively at the output of multiplier 65 and are added up in product accumulator 67 to form the sum signal Zj. After the error signal Fj has been calculated in the comparator 69, such signal goes directly — i.e., without attenuation — via switch 73 to multiplier 65 during the period $t_5$. The sample values Aj transmitted during the period $t_5$ from the output of register 58 via store 98 and via the switch 99 — which is closed during period $t_5$ — and to multiplier 65 are attenuated at different factors $\alpha$, depending upon the reguired $\alpha$ profile, in the store 98 before proceeding to the multiplier 65; to this end, immediately after the introduction of each discrete sample value Aj into the store 98, the same receives correction timing signals Tk of a number corresponding to the required attenuation factor $\alpha$. Since the store 98 merely has to attenuate the sample values Aj it receives to extents varying upon the number of correction timing signals Tk it receives, there is no need to change the store 98 over to forward shifting and backward shifting.

Figure 11:
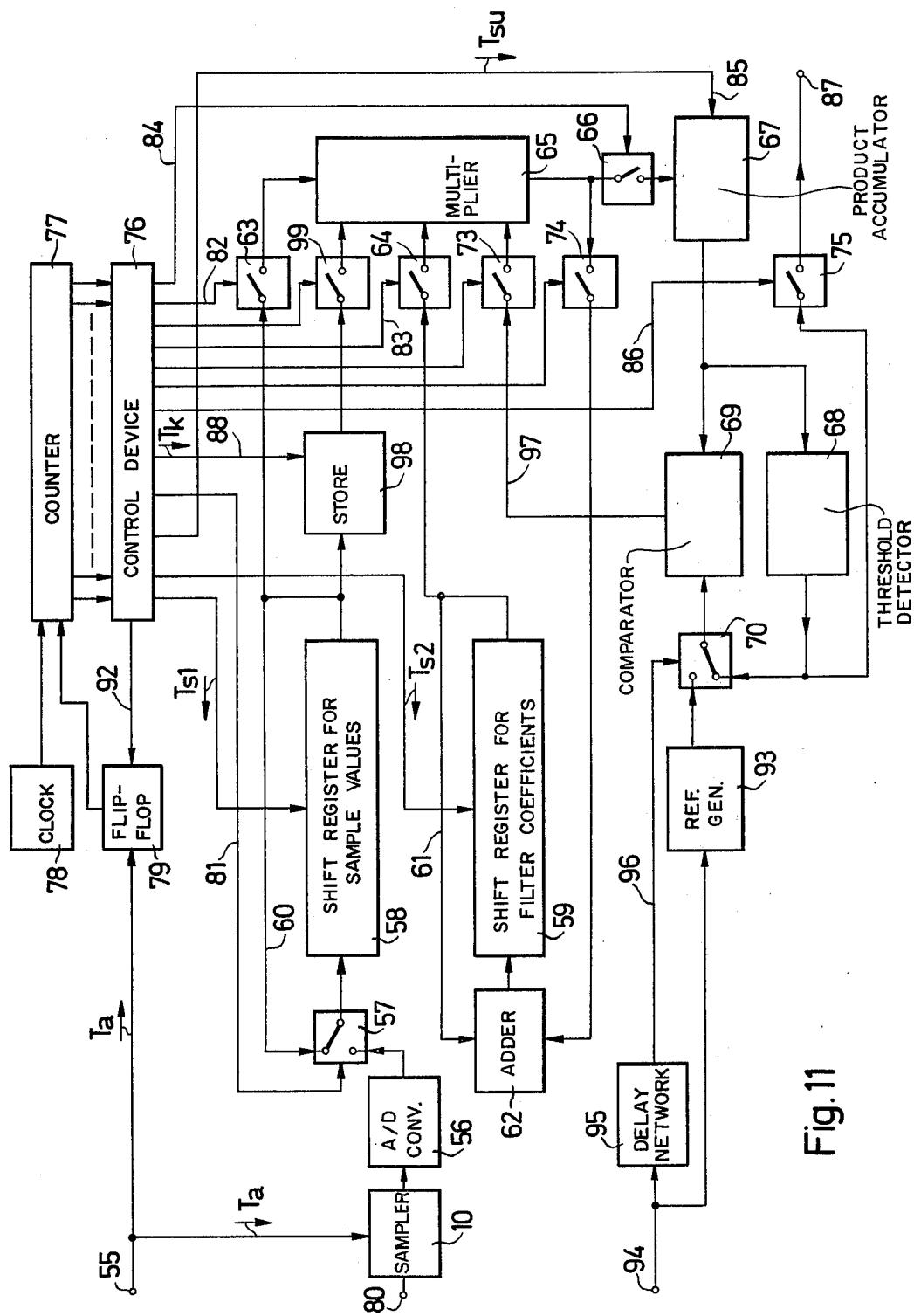
FIG. 11 is a block schematic diagram of a modified form of the corrector shown in FIG. 9.
Figure 12:
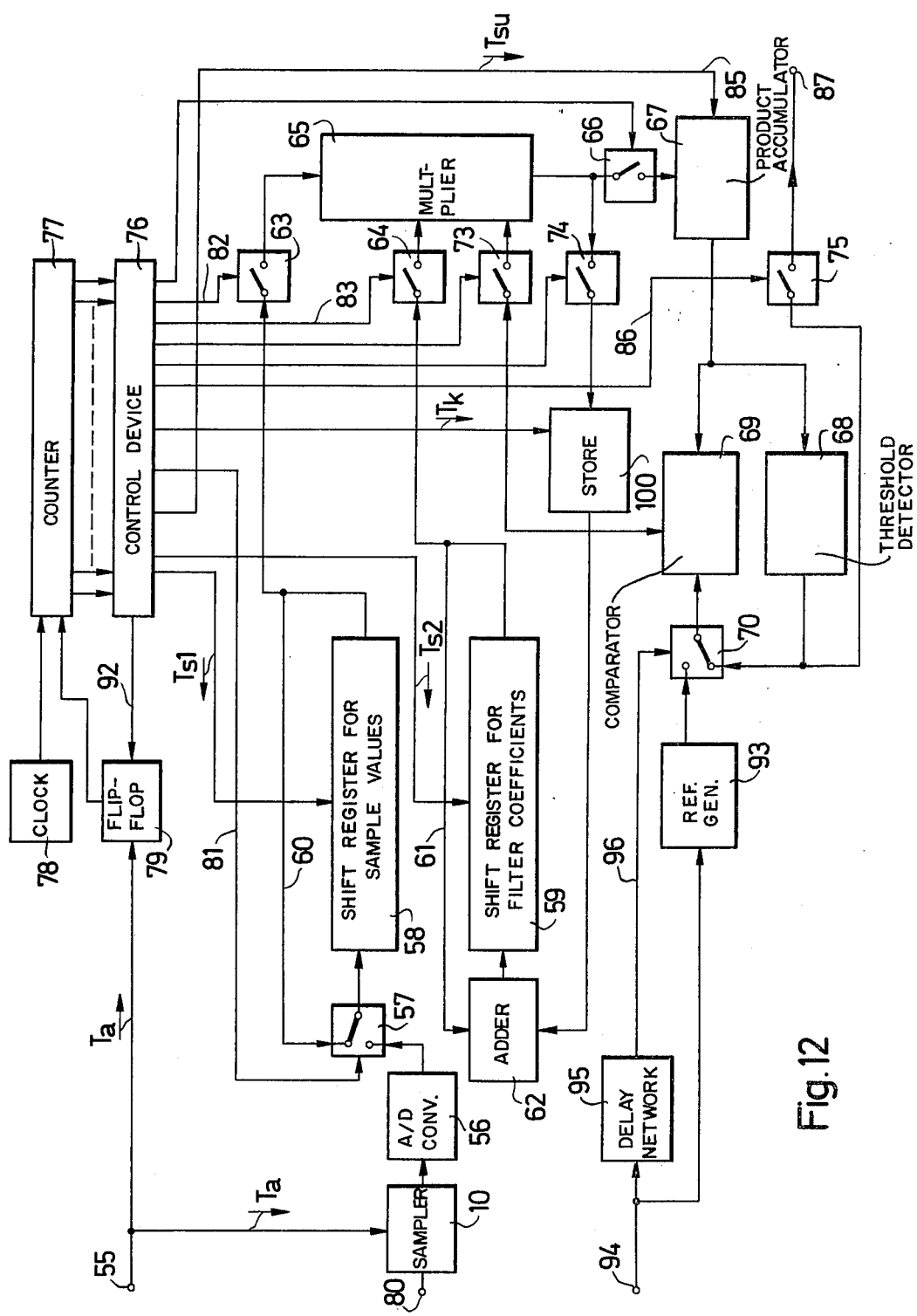
FIG. 12 is a block schematic diagram for another modified form of the corrector shown in FIG. 9.

The corrector shown in FIG. 12 operates in the third way mentioned. In the embodiment of FIG. 12, and as is the case with the correctors shown in FIGS. 8 and 11, during the period $t_2$ the multiplier 65 is supplied directly with the sample values Aj from the output of the shift register 58 by way of the switch 63 and with the filter coefficients Bj from the output of the shift register 59 by way of the switch 64, to form the sum signal Zj. To correct the discrete filter coefficients only the products Aj Bj are formed in multiplier 65 during the period $t_5$. Such products go, via switch 74 which remains closed during the period $t_5$ to a store 100 and only thereafter, attenuated by the factor α, to the adder 62. The correction value ΔBji appears for the first time at the output of store 100 and not, as in the other two embodiments described, at the output of multiplier 65. Attenuation of each value — i.e., each product Aj Bj — entered into store 100 is carried out immediately after such introduction, the store 100 being supplied with correction timing signals Tk of a number which depends upon the extent of attenuation, so that in this case as in the case of the store 98 of the corrector of FIG. 11, no control signals need be supplied for forwards or backwards shifting.

Figure 13A:
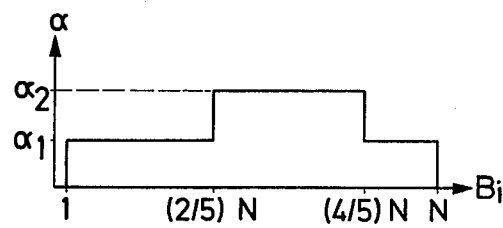
Figure 13B:
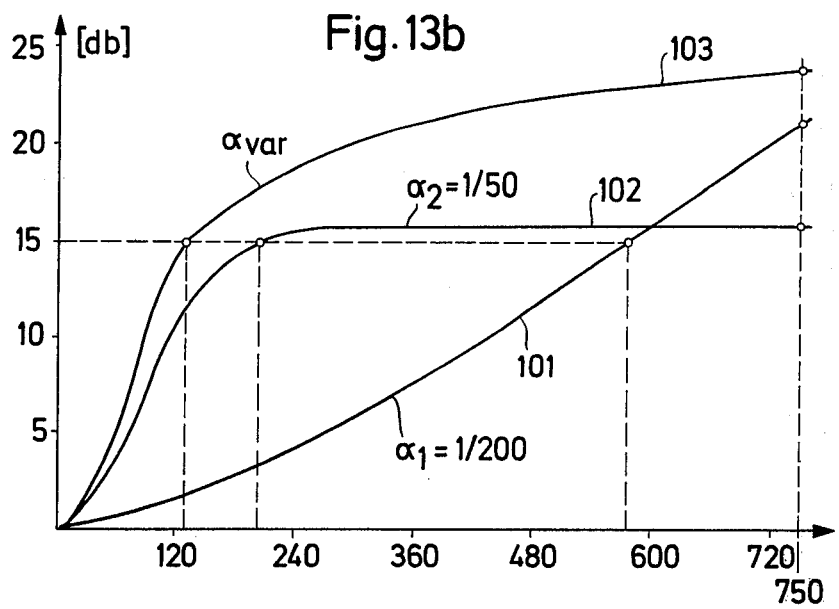
FIG. 13b is based.

FIGS. 13a, b show a graph of the behaviour of the correctors of FIGS. 9, 11 and 12; in FIG. 13b the accuracy of equilization is plotted against time, in the form of the number of sample values processed during the first adjustment phase. As a measure of the accuracy of equilization, the signal-noise ratio S/R is measured in decibels (dB) at the output of adder 69. The effective value of the signal corresponds to the reference signal when all the filter coefficients Bj are zero, a state operative at the beginning of the first adjustment phase. As parameters, two constant attenuation factors $\alpha_1$ and $\alpha_2$ and a step variable attenuation factor $\alpha_{var}$ are used. The signal format used is partial response signal — i.e., the signal sequence produced by the reference generator 93 as supplied through a modelling filter to selector 70.

During the first phase of adjustment the filter coefficients Bj build up consecutively and the corrector output signal forms gradually and tends towards the ideal value but never completely reaches it.

Curve 101 shows the behaviour of a corrector in which the filter coefficients are calculated with a constant attenuation factor $\alpha_1$ of 1/200. Because of the low attenuation factor the filter coefficients Bj build up slowly since each discrete sample value contributes little to forming the filter coefficients. The accuracy of adjustment achieved is relatively high, but only after a relatively long first phase of adjustment.

Curve 2 represents the pattern of a corrector in which the filter coefficients are calculated with a constant attenuation factor $\alpha_2$ of 1/50. Because of the higher factor $\alpha_2$ the coefficients Bj build up relatively much faster than in the case of the curve 101, but the final accuracy is much poorer, being e.g., less than 16 dB, because, as previously stated with reference to FIG. 5, the filter coefficients Bj have a relatively large hunting area ΔBj around the final value.

Curve 103 shows the behaviour of the embodiments of correctors according to the invention using an α profile of the kind shown in the top part of FIG. 5. Such correctors have N storage cells 36 (embodiment of FIG. 8) of N-stage shift registers 58, 59 (embodiments of FIG. 9, 11 and 12). Correspondingly, N filter coefficients Bj have to be formed. In accordance with the α profile shown, the filter coefficients 1 to 2/5 N are calculated by means of the attenuation factor $\alpha_1$ = 1/200, the filter coefficients (2/5 N+1) to 4/5 N are calculated by means of the attenuation factor $\alpha_2$ = 1/50, and the factor $\alpha_1$ of 1/200 is used again to calculate the remaining filter coefficients (4/5 N+1) to N. The pattern of the curve 103 associated with use of the α profile is suprising since the filter coefficients build up faster than in the case of the curve 102 and the attainable final accuracy value is not quite as high as for the curve 101 but much higher than for the curve 102.

Experiments have shown that once accuracy, in the form of the signal-to-noise ratio S/R, has reached a value of 15 dB, the system can be changed over from the first adjustment phase to the second adjustment phase, a changeover initiated by moving the selector 70 to the position shown in FIGS. 9, 11 and 12. In the system according to the invention as exemplified by curve 3, the 15 dB level of S/R is reached after about 130 samples. Correctors using a constant factor $\alpha_1$ of 1/50 to form the filter coefficients take, according to curve 102, 200 samples to reach the changeover level, while correctors using a constant factor $\alpha_2$ of 1/200 to form the filter coefficients takes as many as 580 samples to reach the changeover level, as indicated by curve 101. The first phase of adjustment for the correctors according to the invention hereinbefore described and having a built-in α profile, is approximately 40% shorter than the first adjustment phase of known correctors using a relatively high attenuation factor.

Figure 14A:
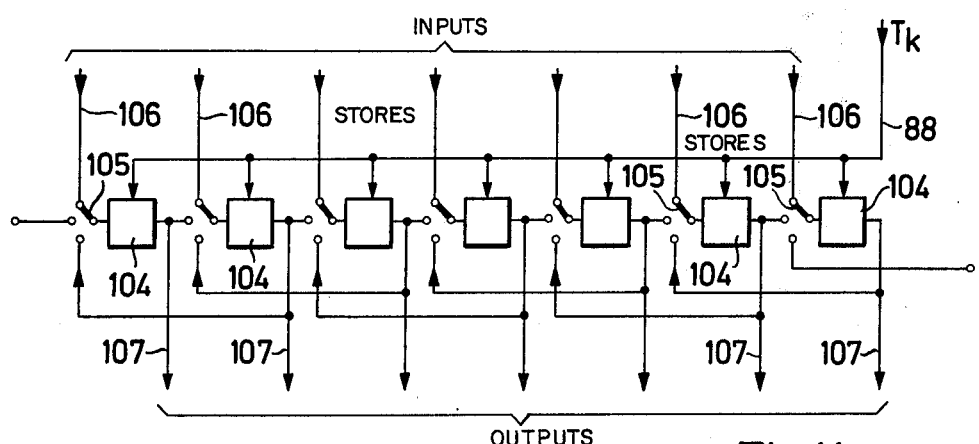
FIG. 14a is a simplified block schematic diagram of a shift register in which the stored information can be moved forwards and backwards.
Figure 14B:
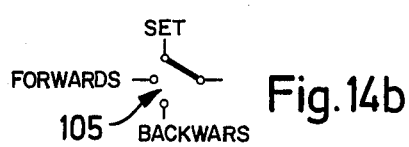

FIG. 14a is a block schematic diagram of the store 72 used in the corrector of FIG. 9. Store 72 is a shift register, the input of each storage cell or stage 104 being connected to one switch 105 each. When store 72 receives a control signal via lines 89 or 91 (which are shown in FIG. 9 but not in FIG. 14a), the switches 105 (FIG. 14b) can all be changed over synchronously, by means which are not shown, from the normal position shown in FIGS. 14a, b into a first or second operative position.

With the switches 105 in the position shown in FIG. 14a, the error signal Fj produced by comparator 69 is supplied to the store in binary form via the multiple line 71 and is written into the discrete stores 104 via the inputs 106 during the period or portion of time $t_3$. The attenuated error signal is introduced in parallel form into multiplier 65 via outputs 107 and via the multiple switch 74. Attenuation of the binary error signal is produced by shifting of the data introduced into store 72.

The operator of such a shift will be described in greater detail hereinafter with reference to a simple example and to the following Table, on the assumption that the error signal has the decimal value 9.

| Cells | 1 | 2 | 3 | 4 | 5 | 6 | 7 |
|---|---|---|---|---|---|---|---|
| Valencey | $2^4$ | $2^3$ | $2^2$ | $2^1$ | $2^0$, | $2^{-1}$ | $2^{-2}$ |
| Binary Value 9 | 0 | 1 | 0 | 0 | 1, | 0 | 0 |
| Shift forwards twice | | | | ↘ | | ↘ | |
| 9:4 = 2.25 | 0 | 0 | 0 | 1 | 0, | 0 | 1 |
| Shift backwards once | | | ↙ | | | ↙ | |
| 9:2 = 4.5 | 0 | 0 | 1 | 0 | 0, | 1 | 0 |
| Shift forwards once | | | | ↘ | | ↘ | |
| 9:4 = 2.25 | 0 | 0 | 0 | 1 | 0, | 0 | 1 |

The storage cells numbered 1 to 7 are the cells 104 of the store 72 of FIG. 14a, counting from the left. The decimal point is between the fifth and sixth cells so that, for instance, the valencey 2° is allotted to the fifth cell. After the binary value 9 has been written in, a 1 is stored at the second and fifth cells and a 0 is stored in each of the other cells. If the store 72 now receives via the line 88 two correction shift signals Tk while the switches 105 are in the "shift forwards" position, the contents of each cell 104 are shifted two cells to the right — i.e., forwards. This situation is indicated in the fifth line of the table. The new binary value corresponds to the decimal value 2.25 which is one-quarter of 9. The forwards two-place shift of the data stored in store 72 has attenuated the stored value by a factor of 4.

A one-place backwards shift of the data in the store 72, a situation shown in the seventh line of the Table, means that the value previously stored is multiplied by 2. Another shift of the information, but in the forwards direction, attenuates the value by a factor of 2.

The attenuations resulting from shifting in the store 72 depend upon the number $q$ of storage cells by which the written-in value can be shifted forwards. The value of the attenuation factor $a$ is related to the number $q$ by the following relationship:

$$a = \tfrac{1}{2}^q$$

and is in the case of forwards shift by 7 cells, 1/128. If a value introduced into the store 72 is required to be attenuated satisfactorily by the factor of 128, the store must have at least 12 cells.

The attenuation factor can be increased readily by a backwards shift of the stored information through an appropriate number of cells. To this end, the store receives a control signal which changes the switches 105 over into the shift backwards position, whereafter each arriving correction shift signal Tk causes the complete contents to be shifted backwards by one place or cell.

During the period $t_3$ (see FIG. 10) the error signal Fj is introduced into store 72 of the corrector of FIG. 9. During the period $t_4$ a 7-place forwards shift of the introduced value attenuates the stored value by a factor of 128. During the period $t_5$ the first three filter coefficients are calculated with the attenuation factor of 1/128, whereafter to calculate the fourth and fifth coefficients the value present in store 72 is shifted back by one place so that the attenuation factor of 1/64 can be used for the two latter filter coefficients. The value present in the store 72 is then advanced by one place so that the attenuation factor of 1/128 can be used for all other filter coefficients.

The control signals responsible for the forward or backwards shifting of the information in the store 72, in association with the correction shift signals Tk, are produced by the mechanism 76. The shape of the profile depends on the program on which the mechanism 76 operates. Since the program can be chosen freely within a large area, a correspondingly large number of profiles can be set up for calculating or correcting the filter coefficient in the correctors according to the invention.

What is claimed is:

1. A method for establishing optimum attenuator settings in a transversal equalizer intended for correction of distortion imposed upon pulse-amplitude-modulated communication signals in passage through a transmission medium comprising in a first phase:
    a. generating a first reference signal sequence at the transmitting end of said transmission medium, transmitting it to the receiving end of the latter and feeding it to the transversal equalizer,
    b. generating at the receiving end a second reference signal sequence identical with the first reference signal sequence,
    c. deriving a first error signal from a comparison of a first signal of said second reference signal sequence and a corresponding signal of a first output signal sequence produced by said transversal equalizer when fed with said first reference signal sequence,
    d. adjusting the attenuator settings in response to said error signal and thereby imparting to the error signal at least two different weights for the adjustment of at least two respective numbers of attenuator settings, and
    e. repeating the steps c) and d) with subsequent signals of the respective signal sequences thus incrementally readjusting the attenuator settings in order that said output signal sequence and said second reference signal sequence at least approximatively converge; and in a second phase:
    f. transmitting communication signals through the transmission medium and feeding them to the transversal equalizer,
    g. deriving by threshold detecting third reference signals from a second output signals produced by said transversal equalizer when fed with the communication signals,
    h. deriving second error signals from a comparison of subsequent second output signals and the corresponding third reference signals, and
    i. readjusting the attenuator settings in response to said second error signals in order to compensate for alterations of the transmission system.

2. The method of claim 1 wherein the step i) is performed according to step d).

3. The method of claim 1 wherein the attenuator settings are adjusted by groups, the attenuator settings of each group relating to adjacent storage places along a delay line contained in said transversal equalizer, and wherein the error signal is imparted a weight for the adjustment of the group relating to the middle storage places which is larger than the weight imparted for the adjustment of the other groups.

4. The method of claim 3 wherein the weights decrease monotonicly from their maximum value for the middle group and wherein the weights for the adjustment of adjacent groups differ by the factor 2.

5. The method of claim 1 wherein reference signals and communication signals are sampled and fed in sampled form to the transversal equalizer and wherein the attenuator settings are readjusted for each sample value.

6. A method for establishing optimum attenuator settings in a transversal equalizer intended for correction of distortion imposed upon pulse-amplitude-modulated communication signals in passage through a transmission medium, wherein the equalizer there is generated from each input signal a number of delayed signals, each such signal is attenuated by an attenuator and the thus attenuated signals are summed to produce the corresponding equalizer output signal, the method comprising in the first phase:
    a. generating a first signal sequence at the transmission end of said transmission, transmitting it to the receiving end and feeding it to said transversal equalizer,
    b. generating at the receiving end a second reference signal sequence identical with the first reference signal sequence,
    c. deriving a first error signal from a comparison of a first signal of said second reference signal sequence and a corresponding signal of a first output signal sequence produced by said transversal equalizer when fed with said first reference signal sequence,
    d. calculating correction values for the attenuator settings by multiplying the instantaneous values of respective delayed signals with said error signal and with a respective weighting factor from 0 to 1, whereby for the calculation of at least one number of correction values there is used a larger weighting factor than for the calculation of the other correction values, e. adjusting the attenuator settings of the transversal equalizer by adding the thus calculated correction values to the corresponding instantaneous attenuator settings, and f. iteratively repeating steps c) – e) with subsequent signals of said second reference signal sequence and said first output signal sequence in order that said first output signal sequence and said second reference signal sequence at least approximatively converge; and in a second phase:

g. transmitting communication signals through the transmission medium and feeding them to the transversal equalizer, h. deriving by threshold detecting third reference signals from second output signals produced by the transversal equalizer when fed with said communication signals, i. deriving second error signals from a comparison of subsequent second output signals and the corresponding third reference signals, and j. readjusting the attenuator settings in response to said second error signals in order to compensate for alternations of the transmission medium.

7. The method of claim 6 wherein the step j) is performed according to steps d) and e).

8. Apparatus for correction of distortion imposed upon pulse-amplitude-modulated communication signals in passage trough a transmission medium comprising a transversal equalizer at the receiving end of said transmission medium receiving transmitted signals, the attenuator settings of said equalizer being adjustable, means connectable to said equalizer generating a second reference signal sequence, threshold means generating a third reference signal sequence from output signals of said equalizer, comparing means deriving error signals from a comparison of subsequent output signals of said equalizer and corresponding signals of said second or third reference signal sequence, respectively, means responsive to said error signals incrementally adjusting said attenuator settings in response to said error signals, said adjusting means including an attenuating means imparting to said error signal at least two different weights for the adjustment of at least two respective numbers of attenuator settings, and switching means connecting in accordance with a given programme said comparing means to either the means generating the second reference signal sequence or to the threshold means.

9. The apparatus of claim 8 wherein the transversal equalizer comprises a delay line including a number of storage places and a respective attenuator connected with each storage place, wherein the adjusting means responsive to said error signals comprises for each attenuator within the transversal equalizer a separate adjusting circuit including a multiplier and an accumulator, and wherein the attenuating means including in the adjusting means consists of at least two attenuating multipliers, the multipliers of the adjusting circuits being connected in parallel by groups with one of their inputs and each group of multipliers being connected by their common inputs to the output of a respective one of said attenuating multipliers.

10. The apparatus of claim 8 further comprising a sampling device connected in series with the input of said equalizer and wherein the adjusting means responsive to the error signals is adapted to sequentially readjust the attenuator settings after each sampling step.

11. The apparatus of claim 10 further comprising a analog-to-digital converter connected in series with the equalizer input, and wherein the equalizer and all related means are adapted to work digitally.

12. The apparatus of claim 10 wherein the transversal equalizer and the adjusting means responsive to said error signals comprise a first shift register back-coupled via a first switch means for storing a number of sample values from said sampling device, a second shift register back-coupled via an adder for storing a corresponding number of attenuator settings, a controllable attenuator for attenuating error signals from said comparing means, a multiplier having its inputs connected via second switch means to said shift register and to said controllable attenuator, and having its output connected via third switch means to said adder and to a product accumulator connected to said comparing means, and a control device controlling said switch means, said shift register and said controllable attenuator so that for each sample value fed into the first shift register first all the sample values stored within the latter are sequentially multiplied by the corresponding attenuator settings stored within the second shift register by means of said multiplier, the thus obtained products are summed up by the product accumulator and fed to said comparing means which generates a corresponding error signal, and then the sample values are sequentially multiplied by individually attenuated error signals, whereby the degree of attenuation of the controllable attenuator is controlled according to a given programme contained in the control device, and the thus obtained products are fed to said adder and added to their corresponding attenuator settings.

13. The apparatus of claim 10 wherein the transversal equalizer and the adjusting means responsive to said error signals comprise a first shift register back-compled via a first switch means for storing a number of sample values from said sampling device, a second shift register back-coupled via an adder for storing a corresponding number of attenuator settings, a controllable attenuator for attenuating the sample values from said first shift register, a multiplier having a input connected via second switch means and said controllable attenuator to said first shift register, two other inputs being connected via third and forth switch means to said shift register and said comparing means, and the output being connected via fifth switch means to said adder and to a product accumulator connected to said comparing means, and a control device controlling said switch means, said shift register and said controllable attenuator so that for each sample value fed into the first shift register first all the sample values stored within the latter are sequentially multiplied by the corresponding attenuator settings stored within the second shift register by means of said multiplier, the thus obtained products are summed up by the product accumulator and fed to said comparing means which generates a corresponding error signal, and then the sample values are individually attenuated by said controllable attenuator in accordance with a given programme contained in the control device, the thus attenuated sample values are sequentially multiplied by said error signals, and the thus obtained products are fed to said adder and added to their corresponding attenuator settings.

14. The apparatus of claim 10 wherein the transversal equalizer and the adjusting means responsive to said error signals comprise
- a first shift register back-coupled via a first switch means for storing a number of sample values from said sampling device,
- a second shift regster back-coupled via an adder for storing a corresponding number of attenuator settings,
- a multiplier having its inputs connected via second switch means to said first and second shift registers and said comparing means,
- a product accumulator connected via a third switch means to the output of said multiplier and further connected to said comparing means.
- a controllable attenuator connected by its input via a forth switch means to output of said multiplier and by its output to said adder, and
- a control device controlling said switch means, said shift registers and said controllable attenuator so that for each sample value fed into the first shift register first all the sample values stored within the latter are sequentially multiplied by the corresponding attenuator settings stored within the second shift register by means of said multiplier, the thus obtained products are summed up by the product accumulator and fed to said comparing means which generates a corresponding error signal, and then the sample values are sequentially multiplied by the error signal and the thus obtained products are individually attenuated by said controllable attenuator whereby the attenuator degrees of the latter are controlled in accordance with a given programme within said control device, and the thus attenuated products are fed to the adder and added to their corresponding attenuator settings.

15. The apparatus of claim 10 wherein the attenuating means is a shift register.

* * * * *